(12) United States Patent
Schindler

(10) Patent No.: US 8,492,651 B2
(45) Date of Patent: Jul. 23, 2013

(54) HOUSING

(75) Inventor: Timo Schindler, Bischoffen (DE)

(73) Assignee: Rittal GmbH & Co. KG, Herborn (DE)

( * ) Notice: Subject to any disclaimer, the term of this patent is extended or adjusted under 35 U.S.C. 154(b) by 138 days.

(21) Appl. No.: 13/138,023

(22) PCT Filed: Jan. 22, 2010

(86) PCT No.: PCT/EP2010/050721
§ 371 (c)(1),
(2), (4) Date: Jun. 24, 2011

(87) PCT Pub. No.: WO2010/084170
PCT Pub. Date: Jul. 29, 2010

(65) Prior Publication Data
US 2011/0266934 A1  Nov. 3, 2011

(30) Foreign Application Priority Data
Jan. 22, 2009 (DE) .......................... 10 2009 005 716

(51) Int. Cl.
*H02G 3/08* (2006.01)
(52) U.S. Cl.
USPC ................. 174/50; 174/58; 174/63; 174/520; 439/535

(58) Field of Classification Search
USPC ... 174/50, 58, 63, 53, 520; 439/535; 248/906; 220/4.02
See application file for complete search history.

(56) References Cited

U.S. PATENT DOCUMENTS

| | | | |
|---|---|---|---|
| 5,722,863 A | 3/1998 | Yanase | |
| 5,789,702 A * | 8/1998 | Perella | 174/481 |
| 6,561,522 B1 | 5/2003 | Radelet et al. | |
| 7,503,790 B2 | 3/2009 | Bodmann et al. | |
| 2009/0152821 A1 | 6/2009 | Bodmann et al. | |

FOREIGN PATENT DOCUMENTS

| | | |
|---|---|---|
| DE | 10 2006 006 386 A1 | 8/2007 |
| EP | 2 012 573 A2 | 1/2009 |
| WO | WO 99/41531 A1 | 8/1999 |

* cited by examiner

*Primary Examiner* — Dhirubhai R Patel
(74) *Attorney, Agent, or Firm* — Marshall & Melhorn, LLC

(57) ABSTRACT

A housing is used to accommodate electrical switching components. The housing includes a housing body, a cover, and a seal between the housing body and the cover. The cover is fastened to the housing body using fastening elements. A smooth transition is formed between the side parts of the housing body and the cover on the housing side having the seal. Thus a particularly easy to clean housing can be provided, wherein the housing meets the exceptional hygienic requirements that exist, for example, in the field of the food industry or in medical fields. In the housing as descried, soiling can no longer collect on the housing.

8 Claims, 3 Drawing Sheets

HOUSING

BACKGROUND OF THE INVENTION

The invention relates to a housing which is used to accommodate in particular electrical switching components, comprising a housing body, a cover and a seal between the housing body and the cover, wherein the cover is fastened to the housing body using fastening elements.

The invention further relates to a method for changing over a seal of such a housing.

Such housings, also referred to as terminal boxes or used in the industrial environment as key housings, are known in various dimensions and embodiments and are needed in particular for accommodating electrical switching components or subdistributions.

Such housings are known from the prior art in various embodiments. Additionally to housing embodiments made of plastic, embodiments made of metal, in particular aluminum, galvanized sheet or stainless steel are often used.

Often, these housings do not meet the high hygienic requirements as they are imposed for example by the food industry. For example, it is difficult to clean these housings, since there is a gap between housing cover and housing body in which dirt may accumulate very quickly. The seals are often designed as foamed polyurethane seal which comprise only a low resistivity against detergents and/or disinfectants. Furthermore, such seals tend to a certain liquid absorption. A further disadvantage results for example also from the use of Philips screws as fastening elements. Dirt can settle here easily. Furthermore, in particular in regions of high potential of contamination due to splashing water or splashing liquids, respectively, liquids cannot drain in a defined manner owing to the common housing shapes, so that they partly dry at the housing. Therefore, use of these housings, in particular in fields having exceptional hygienic requirements, such as for example in food industry or even in clean room areas is only suitable to a limited extent.

SUMMARY OF THE INVENTION

It is therefore the object of the invention to provide a housing concept which in particular satisfies higher hygienic demands.

It is furthermore object of the invention to provide a method to change over existing housings which are used for accommodating in particular electric switching components, which allows to qualify these with regard to higher hygienic demands.

The object of the invention is solved by forming a gapless transition between the side parts of the housing body and the cover on the housing side having the seal.

Thus, a smooth transition between housing body and cover can be realized, so that these housings can be easily cleaned compared to otherwise common terminal boxes and key housings. Dirt cannot longer settle between the cover and the housing body. Housings embodied in this manner are particularly easy to clean and therefore satisfy higher hygienic demands existing for example in the field of food industry or in clean room areas, e.g. for semiconductor production.

In a preferred embodiment, the seal is integrally formed and comprises a clamping section and a mounting section, wherein said clamping section realizes the smooth transition between housing body and cover at the outside of the housing. The clamping section is designed essentially flat and fills the region between cover and housing body completely, so that a sufficient sealing is guaranteed. The mounting section serves to fix the seal at the housing body or at the cover. The integral configuration of the seal offers, on the one hand, continuously an optimum sealing function and, on the other hand, is advantageous with regard to exchange the seal.

To compensate tolerances it is provided in a construction variant that the clamping section of the seal is pressed on the housing body when fixing the cover and is slightly outwardly curved in relation to the outer contour of the cover and the housing body. Slight doming of the seal is furthermore particularly easy to clean, since gaps or joints are avoided.

A particularly simple mounting of the seal is achieved if the seal can be plugged onto bars of the housing body by means of the mounting section, wherein the bars are at least in sections continuously arranged around the housing body and oriented in direction of the cover. This construction also allows a simple exchange of the seal.

In view of specific splashing water demands, for example when cleaning with high pressure cleaners, the seal may at its outer side comprise one or several continuous sealing lips so that a higher standard of resistivity against splashing water can be achieved.

This seal configured as a plug-on seal is in a preferred embodiment made from silicone as a molding injection part. For example hot cross linking 2K silicones can be used, as they are, among others, known from the companies GE-BAYER-Silicones or WACKER. These silicone seals are mechanically stable and are characterized, aside a high temperature resistivity, by in particular a high chemical resistivity against aggressive detergents or disinfectants. Such seals can be produced with varying Shore hardness.

To prevent drying of liquids at the housing, the housing body is configured as a frustrum of pyramid wherein the side walls of the housing body are inclined with respect to the vertical to the back wall of the housing body. Liquids can drain in a defined manner when using this housing configuration. The tilt angle in relation to the vertical to the rear wall of the housing body should be at least 3° for reliably draining off the liquid.

An additional advantage can be achieved if also the cover comprises a continuous bevel which is inclined with respect to the vertical to the major plane of the cover. Also here a tilt angle in the range of at least 3° has turned out to be advantageous.

A particularly hygiene-compliant and easy to clean attachment of the cover at the housing body can be achieved if the fastening elements are configured as screw bolts which are sealed by means of sealing rings against the surface of the cover. Dirt cannot settle when using such screw bolts. The sealing rings may be embodied as silicone sealing rings as the housing seal is.

In a design variant, the housing body comprises flaps between said bars which in turn comprise mounting fixtures for mounting the fastening elements. These mounting fixtures may for example be embodied as threaded bores.

In a further preferred embodiment, plug mounting fixtures are plugged on the flaps which comprise regions corresponding to the fastening elements by which a fixing of the cover at the housing body is enabled. These plug mounting fixtures can be made from steel sheet and are merely plugged onto the flap as a clip, wherein these comprise regions, which are formed as threadings or quick release fastener elements, for example bayonet fixtures, for the fastening elements (screws, screw balls, bayonet bolts etc.). The flap itself merely possesses a bore or a recess for plugging in the fastening elements. This safes manufacturing costs of the housings, since the working step of cutting threads or welding a nut can be omitted. These plug mounting fixtures, in contrast, can be produced in different sizes particularly cost-effective. A further advantage results from easy exchangeability. In particular for housings made of plastic, a stable and reliable attachment of the cover at the housing body can be achieved therewith.

The object relating to the method is solved in that the housing is opened, the original sealing compound is removed, a continuous integral seal is inserted or plugged onto bars provided therefore and the sealing is smoothly pressed against the housing body by means of the cover using the fastening elements. Thus, already existing terminal or key housings can also be qualified later for higher hygienic demands. Such an exchange can be performed in a time and cost saving manner.

BRIEF DESCRIPTION OF THE DRAWINGS

The invention will be further explained below with the aid of an exemplary embodiment illustrated in the figures. It is shown in.

DETAILED DESCRIPTION OF THE INVENTION

Figure 1:
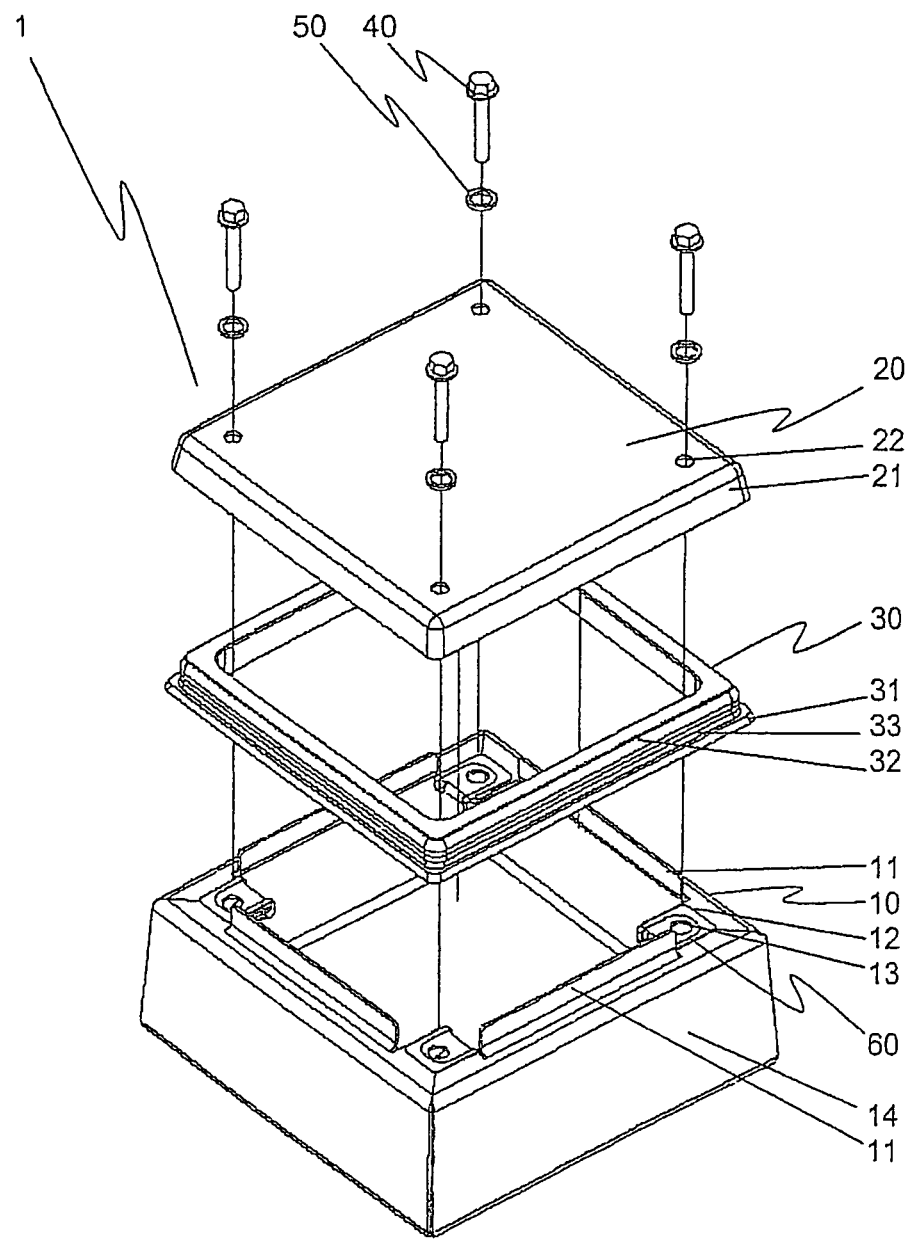
FIG. 1 a housing and its components in an exploded representation.

FIG. 1 shows a housing 1 and its components which are illustrated in an exploded drawings. It consists of a housing body 10, a cover 20 having mounting fixtures 22 in form of bores and a seal 30 embodied as a plug-on or insert seal which is disposed between housing body 10 and cover 20. The cover is fixed to housing body 10 by means of fastening elements 40 realized as screw bolts, wherein sealing rings 50 are provided for sealing which abut the cover surface. Additionally, cover 20 possesses a bevel 21 at its sides.

Housing body 10 is configured in form of a frustum of pyramid, wherein each side wall 14 of housing body 10 is inclined by at least 3° in relation to the vertical to the rear wall of the housing. Bars 11 are formed in sections at the front of housing body 10 onto which seal 30 may be plugged.

Flaps 12 are provided between the bars in the corner regions of housing body 10 which on the one hand comprise mounting fixtures 13 in form of bores and on the other hand plug mounting fixtures 60 which comprise regions corresponding to fastening elements 40 allowing a fixation of cover 20 to housing body 10. Plug mounting fixtures 60 are made from steel sheet and are plugged as clips onto flaps 12, wherein these comprise regions which are formed as threadings or quick release mounting fixtures for fastening elements 40.

Seal 30 is integrally formed as a silicone seal and possesses a clamping section 31 as well as a mounting section 32 serving to plug seal 30 onto bars 11 of housing body 10. Continuous sealing lips 33 may be provided additionally, as shown in FIG. 1. Clamping section 31 of seal 30 is pressed onto housing body 10 between cover 20 and housing body 10 when mounting cover 20, so that a smooth transition between cover 20 and housing body 10 can be realized. Pressing can also be provided such that seal 30 against cover 20 and housing body 10 is slightly curved outwardly.

Figure 2:
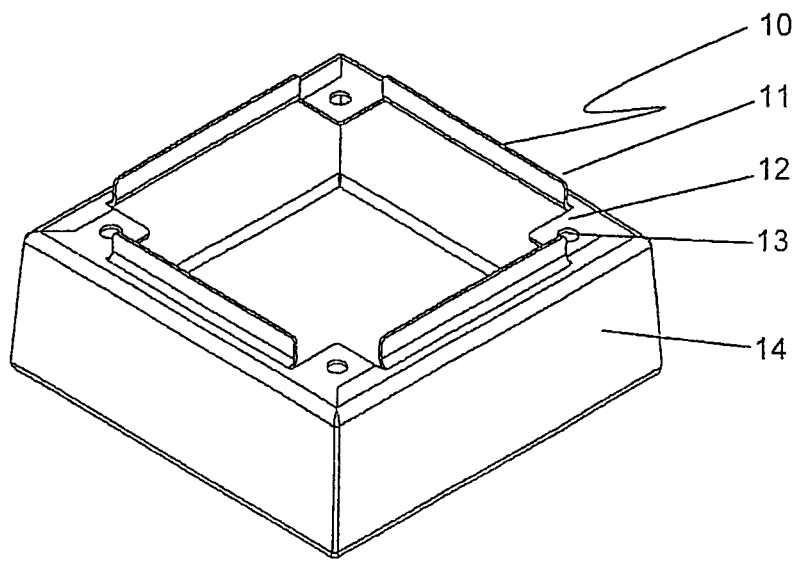
FIG. 2 a housing body of the housing.

FIG. 2 shows housing body 10, as shown with its features already in FIG. 1, separately in a perspective view.

Figure 3:
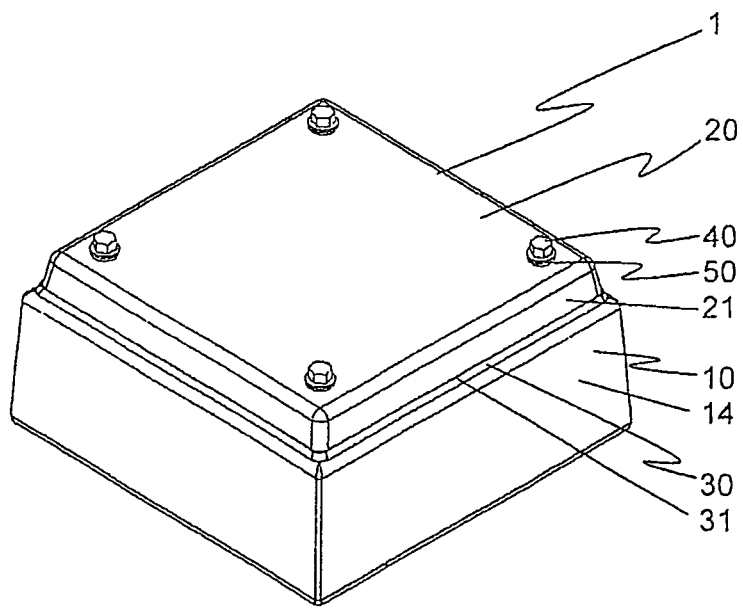
FIG. 3 a perspective view of the housing in a mounted state.

In FIG. 3, housing 1 is shown in a mounted state. Characterizing for this housing 1 is outer seal 30 allowing a smooth transition between the inclined side walls 14 of housing body 10 and bevels 21 of cover 20 by means of clamping section 31. Cover 20 and housing body 10 are screwed by means of fastening elements 40 embodied as screw bolts or quick release fastener bolts, wherein sealing rings 50 serve to seal the screw connection.

Figure 4:
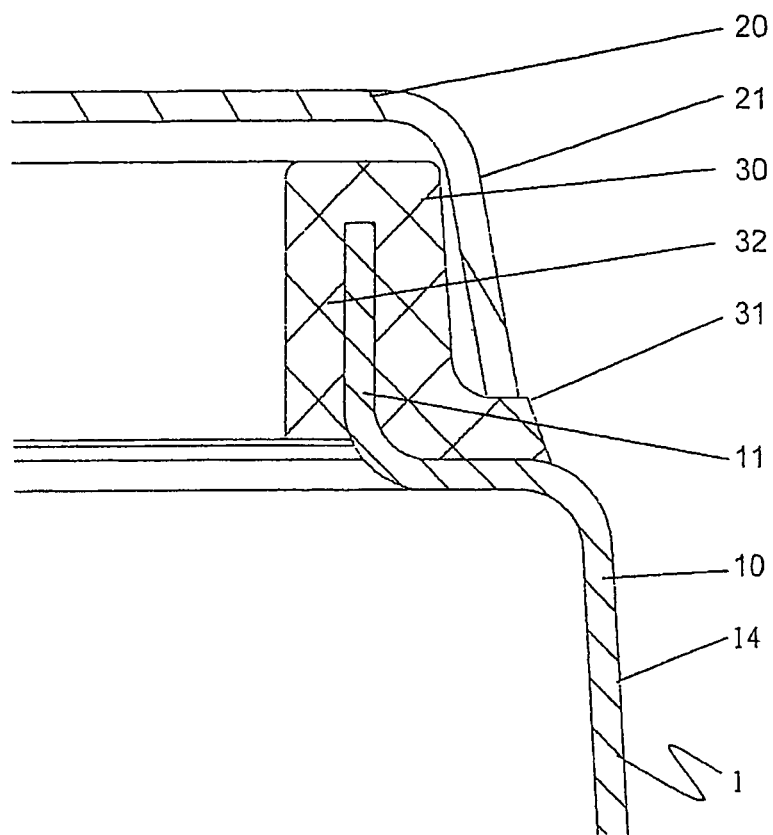
FIG. 4 a partial representation of a cover, of the housing body and of an inserted seal in a sectional view and FIG. 5 the housing in a side view.

FIG. 4 shows a partial illustration of cover 20, housing body 10 and seal 30 plugged onto the bars 11 of housing body 10 by means of mounting section 32 in a sectional view. Clamping section 31 of seal 30 thereby is located between bevel 21 of cover 20 and side wall 14 of housing body 10 and protrudes slightly, as shown in FIG. 4.

Figure 5:
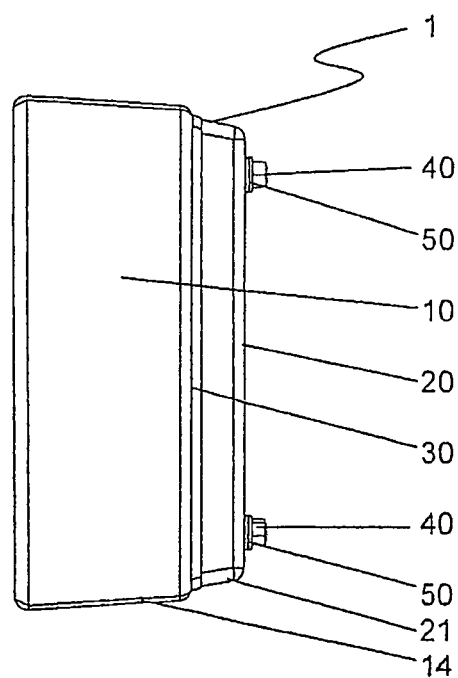

FIG. 5 shows housing 1 as shown with its features in FIG. 3 in a side view. By continuous tilting of side walls 14 of housing body 10 and bevel 21 of cover 20, liquid can be drained particularly well in this mounting orientation of housing 1 and in an orientation rotated by steps of 90°.

In the exemplary embodiments described above, the housing parts consist commonly of galvanized steel sheet having a thickness of 1 to 1.5 mm, of stainless steel sheet, of anodized aluminum sheet or of black plate. Additionally, a powder coating or paint, for example, can be provided as surface finish. Furthermore, glass fiber reinforced resins can be used as materials for housing body 10 and cover 20 which can be produced by an extrusion molding process or by means of injection molding technique. It has furthermore turned out to be advantageous that the surfaces comprise a roughness which is as small as possible ($Ra \leq 0.8$ µm) or consist of dirt repellant materials or ware wasted to be dirt-repellant.

The housing concept described above can in particular satisfy the exceptional hygienic requirements which are common in food industry but also in a clean room area. Terminal boxes or key housings, respectively, can be provided for such fields of use by the smooth housing design as well as by using seal materials which are easy to clean and are resistant against detergents and/or disinfectants.

The invention claimed is:

1. A housing which is used to accommodate in particular electrical switching components, comprising:
    a housing body, the housing body comprising two side walls and a front;
    a cover; and
    a seal between said housing body and said cover,
    wherein said cover is fastened to said housing body using fastening elements at said front of said housing body,
    wherein a smooth gapless transition is formed between the side walls of said housing body and said cover on the portion of the housing having said seal, wherein said seal is configured integrally thus comprising a single part and comprises a clamping section and a mounting section, wherein said clamping section forms said smooth transition between said housing body and said cover on said housing,
    wherein said seal can be plugged on bars of said housing body by means of said mounting section, wherein said bars are at least in sections continuously arranged at said housing body and are oriented in direction of said cover, and
    wherein said housing body comprises flaps between said bars which comprise mounting fixtures for receiving said fastening elements.

2. The housing according to claim 1, wherein said clamping section of said seal is pressed to said housing body when fixing said cover and is slightly curved outwardly with respect to the outer contour of said cover and said housing body.

3. The housing according to claim 1, wherein said seal comprises one or more continuous sealing lips at its outer side.

4. The housing according to claim 1, wherein said seal is made from silicone as an injection molding part.

5. The housing according to claim 1, wherein said housing body further comprises a rear wall, and said housing body is formed as a frustum of pyramid, wherein said side walls of said housing body are inclined with respect to the vertical to the rear wall of said housing body.

6. The housing according to claim 1, wherein said cover comprises a continuous bevel which is inclined with respect to the vertical to the major plane of said cover.

7. The housing according to claim 1, wherein said fastening elements are designed as screw bolts or quick release fastener elements which are sealed against the surface of said cover by means of seal rings.

8. The housing according to claim 1, wherein plug mounting fixtures are laterally plugged onto said flaps which comprise regions corresponding to said fastening elements by means of which fixing said cover to said housing body is allowed.

\* \* \* \* \*